United States Patent [19]

Neff

[11] Patent Number: 4,635,239

[45] Date of Patent: Jan. 6, 1987

[54] DATA PROCESSING

[75] Inventor: Dennis B. Neff, Bartlesville, Okla.

[73] Assignee: Phillips Petroleum Company, Bartlesville, Okla.

[21] Appl. No.: 613,685

[22] Filed: May 24, 1984

[51] Int. Cl.$^4$ .............................................. G01V 1/36
[52] U.S. Cl. ...................................... 367/47; 367/48; 367/41; 364/421
[58] Field of Search ..................... 367/38, 41, 42, 47, 367/48, 60; 324/82, 83 R; 375/118; 364/421, 484

[56] References Cited

U.S. PATENT DOCUMENTS

| | | | |
|---|---|---|---|
| 2,897,351 | 7/1959 | Melton | 250/20 |
| 2,897,477 | 7/1959 | Lindsey | 340/15 |
| 3,289,154 | 11/1966 | Cunningham | 340/15.5 |
| 3,721,954 | 3/1973 | Fontanel et al. | 367/48 |
| 3,968,427 | 7/1976 | Sharrit | 324/83 R |
| 4,157,500 | 6/1979 | Nicoli | 324/83 R |
| 4,320,458 | 3/1982 | Vincent | 367/33 |

FOREIGN PATENT DOCUMENTS

| | | | |
|---|---|---|---|
| 2068552 | 8/1981 | United Kingdom | 367/47 |
| 0622024 | 8/1978 | U.S.S.R. | 367/48 |

OTHER PUBLICATIONS

O'Brien, J. T. et al, "Sign Bit Amplitude Recovery with Applications to Seismic Data", *Geophysics*, vol. 47, No. 11, (Nov. 1982), pp. 1527-1539.

Coffeen, J. A., *Seismic Exploration Fundamentals*, Tulsa, Okla., PPC Books, pp. 115-123.

*Primary Examiner*—Nelson Moskowitz
*Attorney, Agent, or Firm*—French & Doescher

[57] ABSTRACT

Data points for a sinusoidal waveform are assigned 2 bit values which indicate the state of the amplitude (positive or negative) and the slope of the sinusoidal signal at the particular data point (positive or negative). The 2 bit values for a plurality of sinusoidal waveforms are compared to determine the phase misalignment between the plurality of sinusoidal waveforms.

13 Claims, 5 Drawing Figures

QUADRANT ASSIGNMENT

| | |
|---|---|
| 1<br>SLOPE (−) | 0<br>SLOPE (+) |
| AMPLITUDE (+) | |
| 2 | 3 |
| AMPLITUDE (−) | |

QUADRANT ASSIGNMENT

| 1 | 0 |
|---|---|
| SLOPE (−) AMPLITUDE (+) | SLOPE (+) |
| 2 | 3 |
| AMPLITUDE (−) | |

FIG. 3

DATA PROCESSING

This invention relates to data processing. In one aspect, this invention relates to a method for correcting phase misalignment between sinusoidal waveforms.

As used herein, the term sinusoidal waveforms refers to waveforms which periodically pass through four states with respect to amplitude and slope. These states are positive amplitude with positive slope, positive amplitude with negative slope, negative amplitude with negative slope, and negative amplitude with positive slope. A perfect sinusoidal form is not required but, in general, a periodic movement through the four states described above will be present.

The invention is particularly applicable to waveforms encountered in seismic exploration which are referred to as sinusoidal wiggle traces. However, the invention is applicable to correcting phase misalignment between any set (2 or more) of sinusoidal waveforms.

For the sake of convenience, the invention will be described in terms of correcting phase misalignment for sinusoidal wiggle traces obtained in the mapping of geological subsurfaces. Such mapping involves the use of a source of seismic energy and its reception by an array of seismic detectors, generally referred to as geophones. When used on land, the source of seismic energy generally is a high explosive charge electrically detonated in a bore hole located at a selected grid point in a terrain or is an energy source capable of delivering a series of impacts to the earth's surface such as that used in Vibroseis. The acoustic waves generated in the earth by the explosion or impacts are transmitted back from strata boundaries and reach the surface of the earth at varying intervals of time, depending on the distance and the nature of the subsurface traversed. These returning acoustic waves are detected by the geophones, which function to transduce such acoustic waves into representative electrical signals. The plurality of geophones are arrayed in a selected manner to detect most effectively the returning acoustic waves and generate electrical signals representative thereof from which data may be deduced concerning the geological subsurface of the earth.

The outputs from the seismic detectors are commonly summed to produce a composite trace for enhancing the subsurface structure information represented by features of such signals. The purpose of such summing is to give prominence to the important features in the seismic signal and to reduce or remove those features which obscure the important parts of the signal. Both direct and weighted summations of seismic detector array outputs have been used. Of particular importance in signal to noise enhancement are stacking techniques generally known in the art as common midpoint or common depth point stacking.

It is known that common midpoint stacking requires correction of the phase misalignment between the outputs from the seismic detectors which are to be summed. In the past, techniques such as crosscorrelation, which will be described more fully hereinafter, have been utilized to determine the amount of phase shift required to correct for phase misalignment. However, a large amount of computer time is required for processing techniques such as crosscorrelation and also, high amplitude, spurious noise may affect the accuracy of phase shifts determined by crosscorrelation.

It is also noted that many other data processing techniques associated with the processing of seismic data require correction for phase misalignment. It has been estimated that between 25% and 50% of the computer time spent in processing seismic data is spent in correcting phase misalignment which is a further indication of the need for faster and more accurate techniques for correcting phase misalignment.

It is thus an object of this invention to provide a method for correcting phase misalignment between sinusoidal waveforms such as sinusoidal wiggle traces obtained in seismic prospecting which takes less computer time than prior art techniques and is also accurate even if high amplitude, spurious noise is present in the sinusoidal waveforms.

In accordance with the present invention, the amplitude of a plurality of sinusoidal waveforms is sampled at a desired sampling rate. The thus sampled amplitude is converted to a 2 bit equivalent which indicates the state of the amplitude (positive or negative) and the slope of the sinusoidal signal at the particular data point sampled (positive or negative).

Once the amplitude data has been converted to a 2 bit equivalent, the 2 bit values for the plurality sinusoidal waveform are tested for equality against each other. Multiple tests are performed as the waveforms are shifted with respect to each other. It has been found that phase alignment occurs when the maximum number of matches between the 2 bit values for the data points of the plurality of sinusoidal waveforms occurs.

Other objects and advantages of the invention will be apparent from the foregoing brief description of the invention and the claims as well as the detailed description of the drawings which are briefly described as follows:

FIG. 3 is an illustration of quadrant assignment; and

Figure 1:
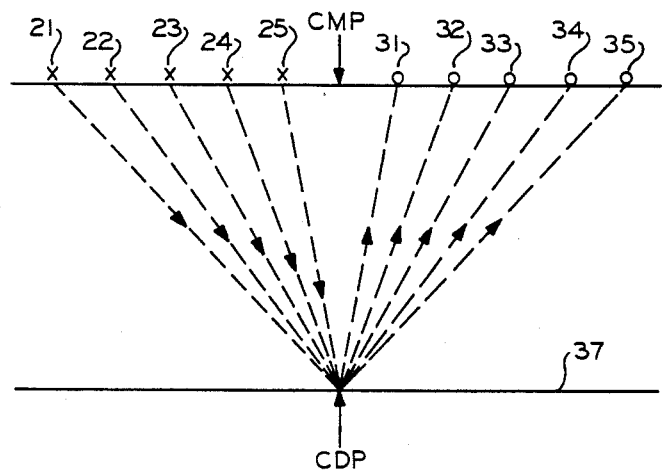
FIG. 1 is an illustration of a typical seismic exploration system.

Referring now to FIG. 1, there is illustrated a plurality of seismic sources 21-25 and a plurality of seismic receivers 31-35 arranged around a common midpoint. For the sake of illustration, the seismic sources are equidistantly spaced and the seismic receivers are equidistantly spaced but this is not required and typically would not occur in seismic prospecting because of obstructions and other factors. However, each source receiver pair should be equally spaced from the common midpoint to the extent possible. Assuming a reflecting plane 37 which is substantially parallel to the surface on which the sources and receivers are located, acoustic waves from each of the seismic sources is reflected from the common depth point and received by a respective one of the seismic receivers as is illustrated. The output from the seismic receivers 31-35 might be as illustrated in FIG. 2.

Figure 2:
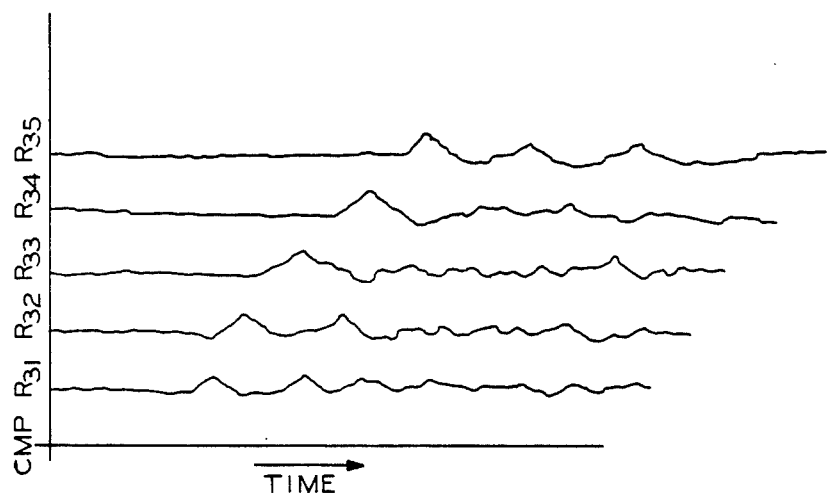
FIG. 2 is an illustration of the waveforms which might be received from the seismic exploration system illustrated in FIG. 1.

The waveforms in FIG. 2, which are illustrated as $R_{31}$–$R_{35}$, are out of phase because of the difference in travel time from the various sources to the various receivers as illustrated in FIG. 1. It is necessary to correct this phase misalignment in order to obtain an optimum summation.

The steps utilized to correct phase misalignment for the sinusoidal wiggle traces illustrated in FIG. 2 in accordance with the present invention are as follows. Some of the steps may be accomplished in a different order if desired.

1. Select Window Length and Sample Rate

A sinusoidal wiggle trace obtained in reflection seismology, such as illustrated in FIG. 2, typically has a length in the range of about 4 seconds to about 8 seconds. A 6-second length is typical.

The amount of phase shift required generally varies over the length of the sinusoidal wiggle trace. More phase shift is generally required for alignment at early time periods for the sinusoidal wiggle trace and less phase shift is generally required for later times.

To accommodate this variance in phase shift required, the sinusoidal wiggle traces, such as illustrated in FIG. 2, are preferably divided into windows or multiple sections. Any desired window length may be utilized but the window length should be sufficient to provide meaningful statistics. In general, the window length should be in the range of about 50 milliseconds to about 200 milliseconds. An average window length is about 100 milliseconds. For a 100 millisecond window length, a sinusoidal wiggle trace having a 6-second duration would be divided into 60 increments or windows.

Any suitable data sample rate may be utilized. However, again, the data sample rate should be such as to provide sufficient data points in a window to provide meaningful statistics. It is believed that about 25 data samples in a window is a minimum for meaningful statistics and thus the sample rate for a 50 millisecond window should be 2 milliseconds or less and the sample rate for a 100 millisecond window should be 4 milliseconds or less. A 4 millisecond sample rate is typical even if windows longer than 100 milliseconds are selected.

As an example of changing the step sequence, it is noted that the window length may be selected after the quadrant assignment of step 2 is completed. However, it is often convenient to select the data sample rate and window length at the same time.

2. Quadrant Assignment

Once a data sample rate has been established, a quadrant assignment is made for each data point in a waveform based on amplitude and slope. For the sake of illustration, this process will be discussed in terms of only two signals but the process is applicable to determining a desired phase alignment for many waveforms.

Considering for the sake of illustration waveforms $R_{31}$ and $R_{32}$ illustrated in FIG. 2, a quadrant assignment will be made for all data points for waveforms $R_{31}$ and $R_{32}$. This quadrant assignment may be as illustrated in FIG. 3 where a data point having a positive amplitude and a positive slope is assigned to quadrant zero and given a zero value, a data point having a positive amplitude and a negative slope is assigned to quadrant 1 and given a one value, a data point having a negative amplitude and a negative slope is assigned to quadrant 2 and given a two value and a data point having a negative amplitude and positive slope is assigned to quadrant 3 and given a three value.

It is noted that amplitude data will typically be in a 16 or 32 bit format. Conversion to a 2 bit equivalent (00, 01, 10, 11) is a particularly important aspect of the present invention with respect to saving computer time as will be described more fully hereinafter.

Equations which can be utilized to make a quadrant assignment to the data points of waveforms $R_{31}$ and $R_{32}$ are as follows. The data point is assumed to be data point 1.

If $A_1 \geqq 0$ and $(A_1 - A_0) \geqq 0$ then $Q_1 = 0$
If $A_1 \geqq 0$ and $(A_1 - A_0) < 0$ then $Q_1 = 1$
If $A_1 < 0$ and $(A_1 - A_0) < 0$ then $Q_1 = 2$
If $A_1 < 0$ and $(A_1 - A_0) \geqq 0$ then $Q_1 = 3$ where $A_1$ = amplitude of data point 1 (16 or 32 bit)
$A_0$ = amplitude of the previous data point (16 or 32 bit)
$Q_1$ = quadrant assignment of data point 1 (2 bit)

It is noted that the quadrant assignments for the data points in a waveform could be made on a window basis such that all data points in a particular window are assigned to a quadrant and then the following steps are accomplished for that particular window. However, it is generally more desirable to make a quadrant assignment for all data points at the same time.

3. Assign Window Times

Windows are assigned to the waveforms to be aligned. As an example, for a 100 millisecond window length, windows might be assigned from time zero. The first window for all waveforms would be from time zero to 100 milliseconds and the second from 100 milliseconds to 200 milliseconds. Windows are assigned to all desired portions of the waveforms.

4. Waveform Shift

Using two signals again for the sake of illustration, one waveform is preferably shifted with respect to the other by a desired phase shift. This phase shift is preferably some multiple of the data sampling rate. As an example, waveform $R_{32}$ might be shifted with respect to waveform $R_{31}$ by 4 milliseconds or in other terms, 1 data point position either left or right. The first shift is referred to as phase shift position 1. Additional shifts are referred to by higher numbers and can start at the maximum phase shift position in one direction and move in the opposite direction so as to eliminate the need to specify shift direction.

5. Bit Comparison

After the desired phase shift is made, the value assigned to data point 1 of window 1 of waveform $R_{31}$ is compared to the value assigned for data point 1 of window 1 of waveform $R_{32}$. Assuming 25 data points in window 1, this process is continued until data point 25 in window 1 for waveform $R_{31}$ is compared to data point 25 in window 1 of waveform $R_{32}$. Window 1 for waveform $R_{31}$ is over the same time interval as window 1 for waveform $R_{32}$.

If the quadrant value assigned to data point 1 of waveform $R_{31}$ is equal to the quadrant value assigned to data point 1 of waveform $R_{32}$, then a value of 1 is added to a correlation total. This process is continued for all comparisons between data points until a final correlation total for window 1 is reached after the comparison of data point 25 for waveform $R_{31}$ to data point 25 for waveform $R_{32}$.

An appropriate equation in BASIC computer language code which may be utilized for the bit comparison and the determination of a correlation total is as follows:

$$SUM(1) = SUM(1) - (Q1(1) = Q2(1))$$

where
SUM(1) = correlation total for shift position #1

Q1(1)=2 bit quadrant value for data point #1 of waveform $R_{31}$

Q2(1)=2 bit quadrant value for data point #1 of waveform $R_{32}$ (Q1(1)=Q2(1)) is a bit mode equality statement which yields a 0 value if Q1(1) and Q2(1) are not equal, or else yields a −1 value if the left and right variables are equal.

6. Repeat Steps 4–5

After a correlation total for shift position 1 is determined, waveforms $R_{31}$ and $R_{32}$ are again shifted with respect to each other as in step 4. Step 5 is then repeated. This process is continued until a correlation total has been derived for all desired phase shifts for window 1. A BASIC computer language code which could be utilized to accomplish steps 4 and 5 for all desired phase shifts for window 1 is as follows.

```
FOR K=FL to LL
FOR J=FD to LD
SUM(K)=SUM(K)−(Q1(J)=Q2(J+K))
NEXT J
NEXT K
``` where

FL=first positional shift for window 1
LL=last positional shift for window 1
FD=first data position for correlation
LD=last data position for correlation
SUM=correlation total 7. Select Highest Correlation Total for Window 1

The highest correlation total for window 1 is determined after all correlation totals have been derived. The phase shift which resulted in this highest correlation total is then noted. It has been found that this phase shift will result in an optimum phase alignment of waveforms $R_{31}$ and $R_{32}$ for window 1.

8. Repeat Steps 4–7 for Additional Windows

After correlation totals for window 1 are established for all desired phase shifts, correlation totals are preferably established for all other windows for all desired phase shifts. The highest correlation total is then used to determine the desired phase shift for each window.

Again, as an example of varying the data processing steps, a correlation total could be established for all windows for phase shift 1 before additional phase shifts are made. Also, the bit comparison for all windows could be made before a correlation total is derived for each window.

A BASIC computer language code which could be used to accomplish steps 4–8 is as follows:

```
FOR L=FW to LW
FOR K=FL to LL
FOR J=FD to LD P1 SUM (L,K)=SUM (L,K)−(Q1(J)=Q2(J+K))
NEXT J
NEXT K
NEXT L
``` where

FW=first window
LW=last window
FL,LL,FD,LD,SUM are as previously defined

9. Output Phase Shifts

The thus determined phase shifts are then output for use by other computer programs as desired. The output phase shifts can be utilized in common depth point stacking of waveforms $R_{31}$–$R_{35}$ as previously described. Also, the phase shifts may be utilized in other applications such as corrections for changes in velocity of near service media which is generally referred to as weathering corrections.

EXAMPLES

The following examples are presented in further illustration of the invention. Since, in some of the examples, the correlation of the present invention will be compared to a conventional crosscorrelation, crosscorrelation will be briefly described hereinafter.

Crosscorrelation is a measure of the similarity of two sinusoidal waveforms. The objective of crosscorrelation is usually to quantify the amount of phase shift (time misalignment) between two waveforms as in the present invention. Crosscorrelation, which is well known to geophysicists, assumes that when the product of amplitudes of individual data points on two waveforms are maximized, the best correlation has been achieved.

Example 1

Figure 4:
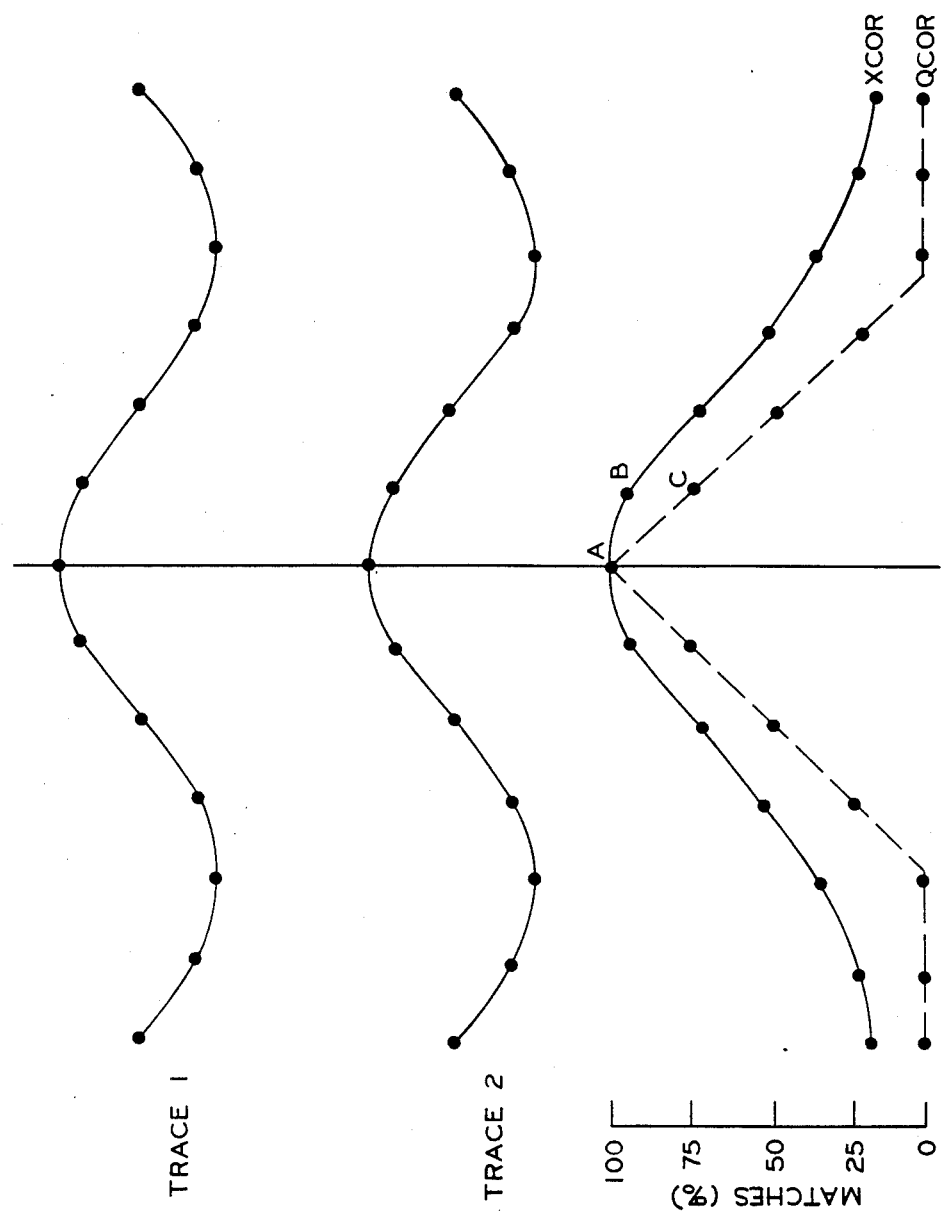
FIGS. 4 and 5 are illustrations of a comparison of correction of phase misalignment in accordance with the present invention to correction of phase misalignment by crosscorrelation.

In FIG. 4 there is illustrated two traces 1 and 2. The traces have been aligned so as to be in phase. In the lower portion of FIG. 4, a comparison of crosscorrelation (XCOR) and quadrant correlation in accordance with the present invention (QCOR) is presented.

Point A is the percentage of matches obtained for the position of the traces illustrated in FIG. 4. It can be seen that both a conventional crosscorrelation and quadrant correlation achieved a 100% match. Thus, both procedures result in an accurate phase alignment of traces 1 and 2 at this phase shift value.

For points B and C, trace 2 was phase shifted 1 data position to the right. This resulted in about 90% matches for crosscorrelation and 75% matches for quadrant correlation. Points to the right of points B and C of the XCOR and QCOR curves of FIG. 4 represent further phase shifts to the right for trace 2. Points to the left of point A of the XCOR and QCOR curves represent shifts to the left for trace 2 with respect to trace 1. The horizontal axis of the graph are plotted as the phase shift between the traces.

As has been previously stated, amplitude data is typically in a 16 or 32 bit format. Crosscorrelation must utilize amplitudes and thus must work with these 16 or 32 bit formats. Thus, while crosscorrelation achieves the same results as quadrant correlation under the circumstances illustrated in FIG. 4, a significant savings in computer time was realized because quadrant correlation requires only 2 bits of data for each data point. In addition, simple computer processes (bit equality tests) were used in place of more complex processes such as multiplication. For quadrant correlation in accordance with the present invention, computer computation time may be decreased on the order of ½ to 1/100 of computation time required for crosscorrelation depending upon the data volume and the computer hardware and software. This savings in computer time is extremely significant when it is realized, as has been previously stated, that generally 25% to 50% of computer time utilized in processing seismic data is utilized in phase alignment.

Another advantage of quadrant correlation with respect to crosscorrelation is the more abrupt decay from a peak value in the quadrant correlation curve illustrated in FIG. 4 as opposed to the crosscorrelation curve (point C is significantly below point B). This more abrupt decay is desirable because the peak correlation value which represents optimum phase shift is more uniquely defined for quadrant correlation and is less sensitive to spurious amplitude noise as will be more fully illustrated in Example 2.

Example 2

Figure 5:
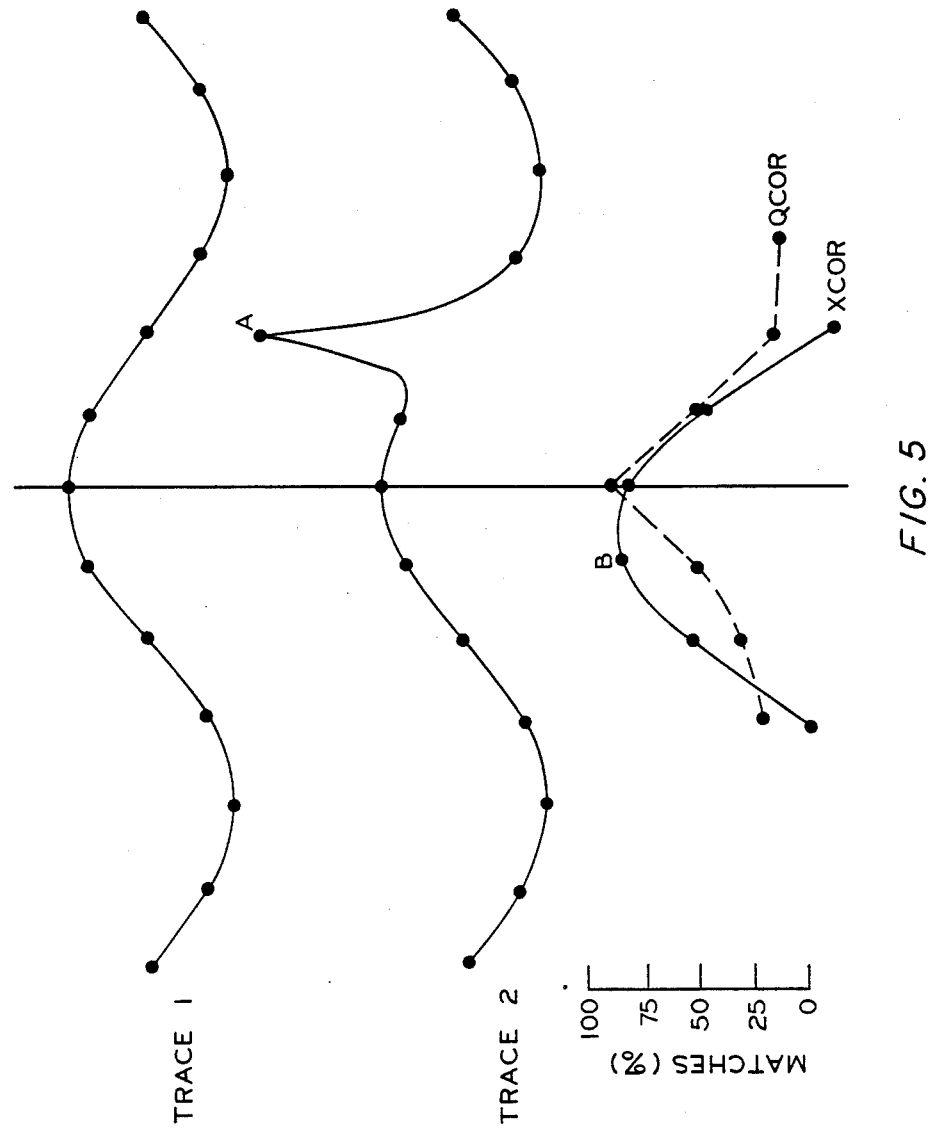

Traces 1 and 2 from FIG. 4 are again illustrated in FIG. 5. However, trace 2 has been distorted by noise at point A. A quadrant correlation curve and crosscorrelation curve are again illustrated in FIG. 5. For the quadrant correlation curve, the highest number of matches occurred for the alignment illustrated in FIG. 5. However, for the crosscorrelation curve, the highest value occurred when trace 2 was shifted one position to the left at B. Thus, crosscorrelation would result in a less accurate phase alignment.

The invention has been described in terms of a preferred embodiment. Reasonable variations are possible within the scope of the invention. As has been previously stated, many different types of sinusoidal waveforms could be processed. Also, other steps might be added to the quadrant correlation in accordance with the present invention and different programs and mathematical techniques could be utilized if desired. Such reasonable variations are within the scope of the present invention, as claimed.

That which is claimed is:

1. A method for determining the phase misalignment between at least a first part of a first sinusoidal waveform and at least a first part of a second sinusoidal waveform, wherein said first sinusoidal waveform and said second sinusoidal waveform are produced in response to the reception of seismic energy from a seismic source by an array of seismic detectors, said method comprising the steps of:
    (a) selecting a plurality of data points in said first part of said first sinusoidal waveform and said first part of said second sinusoidal waveform, wherein said plurality of data points are equally spaced apart;
    (b) assigning a quadrant value to each data point selected in step (a) for said first sinusoidal waveform and said second sinusoidal waveform, wherein a first quadrant value is assigned to a data point if the data point has a positive amplitude and a positive slope, wherein a second quadrant value is assigned to a data point if the data point has a positive amplitude and a negative slope, wherein a third quadrant value is assigned to a data point if the data point has a negative amplitude and a negative slope and wherein a fourth quadrant value is assigned to a data point if the data point has a negative amplitude and a positive slope;
    (c) selecting a first window for said first part of said first sinusoidal waveform and said first part of said second sinusoidal waveform, wherein said window contains a plurality of the data points selected in step (a);
    (d) shifting said second sinusoidal waveform with respect to said first sinusoidal waveform by a first phase shift;
    (e) comparing the quadrant value assigned to the first data point in said first window for said first sinusoidal waveform to the quadrant value assigned to the first data point in said first window for said second sinusoidal waveform shifted by said first phase shift to establish a first correlation value, wherein said first correlation value has a first value if the compared quadrant values are equal and has a second value if the compared quadrant values are not equal;
    (f) repeating step (e) for all data points contained in said first window for said first sinusoidal waveform and said second sinusoidal waveform shifted by said first phase shift, wherein each data point in said first sinusoidal waveform is compared to a corresponding data point in said second sinusoidal waveform;
    (g) summing all correlation values established in steps (e) and (f) to establish a total correlation value for said first window for said first phase shift; and
    (h) repeating steps (d)–(g), wherein different phase shifts are applied in step (d) and wherein the total correlation values derived for each phase shift gives the phase misalignment between said first sinusoidal waveform and said second sinusoidal waveform in said first window.

2. A method in accordance with claim 1 additionally comprising the step of repeating steps (c)–(h), wherein windows are assigned in step (c) to different parts of said first sinusoidal waveform and said second sinusoidal waveform and wherein the repetition of steps (c)–(h) for different windows result in the determination of the phase misalignment between said first sinusoidal waveform and said second sinusoidal waveform for each window assigned to different parts of said first waveform and said second waveform.

3. A method in accordance with claim 2 wherein the phase misalignment between all of said first sinusoidal waveform and all of said second sinusoidal waveform is determined.

4. A method in accordance with claim 3 wherein said first sinusoidal waveform and said second sinusoidal waveform are sinusoidal wiggle traces.

5. A method in accordance with claim 1 wherein said first window has a time length in the range of about 50 milliseconds to about 200 milliseconds and wherein at least 25 data points are contained in said first window.

6. A method in accordance with claim 5 wherein said first window has a time length of about 100 milliseconds.

7. A method in accordance with claim 1 wherein the quadrant value assigned to each data point has a 2 bit value selected from the group consisting of 00, 01, 10 and 11.

8. A method in accordance with claim 7 wherein said first quadrant value is 00, wherein second quadrant value is 01, wherein said third quadrant value is 10 and wherein said fourth quadrant value is 11.

9. A method in accordance with claim 1 wherein the first value of said first correlation value is 1, wherein the second value of said first correlation value is 0 and wherein the phase shift which results in the highest total correlation value is the phase misalignment between said first sinusoidal waveform and said second sinusoidal waveform in said first window.

10. A method comprising:
    (a) imparting seismic waves into the earth from a seismic source;
    (b) receiving reflected seismic waves at an array of seismic detectors so as to generate a first sinusoidal waveform and a second sinusoidal waveform;
    (c) selecting a plurality of data points in at least a first part of said first sinusoidal waveform and at least a first part of said second sinusoidal waveform, wherein said plurality of data points are equally spaced apart;

(d) assigning a quadrant value to each data point selected in step (c) for said first sinusoidal waveform and said second sinusoidal waveform, wherein a first quadrant value is assigned to a data point if the data point has a positive amplitude and a positive slope, wherein a second quadrant value is assigned to a data point if the data point has a positive amplitude and a negative slope, wherein a third quadrant value is assigned to a data point if the data point has a negative amplitude and a negative slope and wherein a fourth quadrant value is assigned to a data point if the data point has a negative amplitude and a positive slope;

(e) selecting a first window for said first part of said first sinusoidal waveform and said first part of said second sinusoidal waveform, wherein said window contains a plurality of the data points selected in step (c);

(f) shifting said second sinusoidal waveform with respect to said first sinusoidal waveform by a first phase shift;

(g) comparing the quadrant value assigned to the first data point in said first window for said first sinusoidal waveform to the quadrant value assigned to the first data point in said first window for said second sinusoidal waveform shifted by said first phase shift to establish a first correlation value, wherein said first correlation value has a first value if the compared quadrant values are equal and has a second value if the compared quadrant values are not equal;

(h) repeating step (g) for all data points contained in said first window for said first sinusoidal waveform and said second sinusoidal waveform shifted by said first phase shift, wherein each data point in said first sinusoidal waveform is compared to a corresponding data point in said second sinusoidal waveform;

(i) summing all correlation values established in steps (g) and (h) to establish a total correlation value for said first window for said first phase shift;

(j) repeating steps (f)–(i), wherein different phase shifts are applied in step (f) and wherein the total correlation values derived for each phase shift gives the phase misalignment between said first sinusoidal waveform and said second sinusoidal waveform in said first window.

11. A method in accordance with claim 10, wherein the first value of said first correlation value is 1, wherein the second value of said first correlation value is 0, said method further comprising the step (k) of shifting said second waveform with respect to said first waveform by the phase shift which results in the highest total correlation value to thereby produce phase aligned first and second waveforms.

12. A method for correcting the phase misalignment between at least a first pair of a first sinusoidal waveform and at least a first part of a second sinusoidal waveform, wherein said first and second sinusoidal waveforms are seismic wiggle traces, said method comprising the steps of:

(a) selecting a plurality of data points in said first part of said first sinusoidal waveform and said first part of said second sinusoidal waveform, wherein said plurality of data points are equally spaced apart;

(b) assigning a quadrant value to each data point selected in step (a) for said first sinusoidal waveform and said second sinusoidal waveform, wherein a first quadrant value is assigned to a data point if the data point has a positive amplitude and a positive slope, wherein a second quadrant value is assigned to a data point if the data point has a positive amplitude and a negative slope, wherein a third quadrant value is assigned to a data point if the data point has a negative amplitude and a negative slope and wherein a fourth quadrant value is assigned to a data point if the data point has a negative amplitude and a positive slope;

(c) selecting a window for said first part of said first sinusoidal waveform and said first part of said second sinusoidal waveform, wherein said window contains a plurality of the data points selected in step (a);

(d) shifting said second sinusoidal waveform with respect to said first sinusoidal waveform by a first phase shift;

(e) comparing the quadrant value assigned to the first data point in said window for said first sinusoidal waveform to the quadrant value assigned to the first data point in said window for said second sinusoidal waveform shifted by said first phase shift to establish a first correlation value, wherein said first correlation value has a first value of 1 if the compared quadrant values are equal and has a second value of 0 if the compared quadrant values are not equal;

(f) repeating step (e) for all data points contained in said window for said first sinusoidal waveform and said second sinusoidal waveform shifted by said first phase shift, wherein each data point in said first sinusoidal waveform is compared to a corresponding data point in said second sinusoidal waveform;

(g) summing all correlation values established in steps (e) and (f) to establish a total correlation value for said window for said first phase shift;

(h) repeating steps (d)–(g), wherein different phase shifts are applied in step (d) and wherein the total correlation values derived for each phase shift gives the phase misalignment between said first sinusoidal waveform and said second sinusoidal waveform in said first window; and (i) shifting said second sinusoidal waveform with respect to said first sinusoidal waveform by the phase shift which results in the highest total correlation value to thereby produce phase aligned first and second sinusoidal waveforms for said window.

13. A method for correcting the phase misalignment between at least a first part of a first sinusoidal waveform and at least a first part of a second sinusoidal waveform, wherein said first and second sinusoidal waveforms are seismic wiggle traces, said method comprising the steps of:

(a) selecting a plurality of data points in said first part of said first sinusoidal waveform and said first part of said second sinusoidal waveform, wherein said plurality of data points are equally spaced apart;

(b) assigning a quadrant value to each data point selected in step (a) for said first sinusoidal waveform and said second sinusoidal waveform, wherein a first quadrant value is assigned to a data point if the data point has a positive amplitude and a positive slope, wherein a second quadrant value is assigned to a data point if the data point has a positive amplitude and a negative slope, wherein a third quadrant value is assigned to a data point if the data point has a negative amplitude and a negative slope and wherein a fourth quadrant value is assigned to a data point if the data point has a negative amplitude and a positive slope;

(c) selecting a window for said first part of said first sinusoidal waveform and said first part of said second sinusoidal waveform, wherein said window contains a plurality of the data points selected in step (a);

(d) shifting said second sinusoidal waveform with respect to said first sinusoidal waveform by a first phase shift;

(e) comparing the quadrant value assigned to the first data point in said window for said first sinusoidal waveform to the quadrant value assigned to the first data point in said window for said second sinusoidal waveform shifted by said first phase shift to establish a first correlation value, wherein said first correlation value has a first value if the compared quadrant values are equal and has a second value if the compared quadrant values are not equal;

(f) repeating step (e) for all data points contained in said window for said first sinusoidal waveform and said second sinusoidal waveform shifted by said first phase shift, wherein each data point in said first sinusoidal waveform is compared to a corresponding data point in said second sinusoidal waveform;

(g) summing all correlation values established in steps (e) and (f) to establish a total correlation value for said window for said first phase shift;

(h) repeating steps (d)–(g), wherein different phase shifts are applied in step (d) and wherein the total correlation values derived for each phase shift gives the phase misalignment between said first sinusoidal waveform and said second sinusoidal waveform in said window; and (i) shifting said second sinusoidal waveform with respect to said first sinusoidal waveform by the phase shift which results in the total correlation value corresponding to the maximum number of matches between quadrant values for said first sinusoidal waveform and quadrant values for said second sinusoidal waveform, thereby producing phase aligned first and second sinusoidal waveforms for said window.

* * * * *